United States Patent
Schoop et al.

(10) Patent No.: US 8,759,669 B2
(45) Date of Patent: Jun. 24, 2014

(54) BARRIER AND PLANARIZATION LAYER FOR THIN-FILM PHOTOVOLTAIC CELL

(75) Inventors: Urs Schoop, Tucson, AZ (US); Walter Stoss, Tucson, AZ (US); Nguyet Nguyen, Oro Valley, AZ (US); Scott Wiedeman, Tucson, AZ (US)

(73) Assignee: Hanergy Hi-Tech Power (HK) Limited, West KL (HK)

( * ) Notice: Subject to any disclaimer, the term of this patent is extended or adjusted under 35 U.S.C. 154(b) by 182 days.

(21) Appl. No.: 13/351,170

(22) Filed: Jan. 16, 2012

(65) Prior Publication Data

US 2012/0192941 A1  Aug. 2, 2012

Related U.S. Application Data

(60) Provisional application No. 61/433,142, filed on Jan. 14, 2011.

(51) Int. Cl.
| | | |
|---|---|---|
| *H01L 31/00* | (2006.01) | |
| *H01L 21/00* | (2006.01) | |
| *H01L 31/0224* | (2006.01) | |
| H01L 31/0236 | (2006.01) | |
| H01L 31/032 | (2006.01) | |

(52) U.S. Cl.
CPC .... *H01L 31/0224* (2013.01); *H01L 31/022425* (2013.01); *H01L 31/02366* (2013.01); *H01L 31/0322* (2013.01)
USPC ............................. 136/256; 438/95; 438/98

(58) Field of Classification Search
CPC .................. H01L 31/0224; H01L 31/022425; H01L 31/022466; H01L 31/022483; H01L 31/02366; H01L 31/0322
See application file for complete search history.

(56) References Cited

U.S. PATENT DOCUMENTS

| | | | | |
|---|---|---|---|---|
| 3,675,090 A | * | 7/1972 | Neale | 257/3 |
| 3,877,049 A | * | 4/1975 | Buckley | 257/4 |
| 5,688,718 A | * | 11/1997 | Shue | 438/627 |
| 7,053,294 B2 | * | 5/2006 | Tuttle et al. | 136/265 |
| 2001/0002000 A1 | * | 5/2001 | Kumar et al. | 204/192.1 |
| 2006/0096635 A1 | * | 5/2006 | Tuttle | 136/262 |
| 2009/0020157 A1 | * | 1/2009 | Krasnov et al. | 136/256 |
| 2011/0146784 A1 | * | 6/2011 | Addepalli et al. | 136/256 |

OTHER PUBLICATIONS

Yun, J. et al., Proc. 4th World Conf. PV Energy Conversion, p. 509 IEEE, 2006.*

* cited by examiner

*Primary Examiner* — Eli Mekhlin
(74) *Attorney, Agent, or Firm* — Kolisch Hartwell, P.C.

(57) ABSTRACT

Thin film photovoltaic cells and methods of manufacturing such cells that include one or more diffusion barrier layers configured to provide a relatively smooth growth surface for subsequent deposition of a p-type semiconductor layer. Diffusion barrier layers according to the present teachings may be amorphous, microcrystalline or nanocrystalline layers of materials including molybdenum, conductive oxides, conductive nitrides, conductive carbides, or mixtures thereof. In some cases a diffusion barrier layer may be configured to have surface roughness less than a predetermined threshold value.

16 Claims, 5 Drawing Sheets

BARRIER AND PLANARIZATION LAYER FOR THIN-FILM PHOTOVOLTAIC CELL

CROSS REFERENCE TO RELATED APPLICATIONS

This application claims priority under 35 U.S.C. §119 and applicable foreign and international law to U.S. Provisional Patent Application Ser. No. 61/433,142, filed Jan. 14, 2011, which is hereby incorporated by reference in its entirety.

This application incorporates the following patents and patent applications: U.S. Pat. Nos. 7,194,197, 7,760,992, 7,968,353, 8,059,945, 8,062,922, Ser. Nos. 12/976,976, 12/980,151, 12/980,201, 12/424,497, 12/424,505, 12/284,923, 12/397,846, 61/284,956, 61/284,958, and 61/356,194. The disclosures of these patents and patent applications are hereby incorporated by reference in their entirety for all purposes.

BACKGROUND

The field of photovoltaics generally relates to multi-layer materials that convert sunlight directly into DC electrical power. The basic mechanism for this conversion is the photovoltaic effect, first observed by Antoine-César Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage.

The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics. Therefore, a need exists for improved methods and apparatus for depositing thin-film layers onto a non-rigid, continuous substrate.

DETAILED DESCRIPTION

Thin-film PV cells may be based on either rigid or flexible substrates. In the case of flexible substrates, manufacture of the PV cells may proceed by a roll-to-roll process. Aside from the ability to perform roll-to-roll manufacturing, flexible substrates may have certain advantages over rigid substrates. For example, roll-to-roll processing of thin flexible substrates allows for the use of relatively compact, less expensive vacuum systems, and of some non-specialized equipment that already has been developed for other thin-film industries. Furthermore, flexible substrate materials inherently have lower heat capacity than glass, so that the amount of energy required to elevate the temperature is minimized. Flexible substrates also exhibit a relatively high tolerance to rapid heating and cooling and to large thermal gradients, resulting in a low likelihood of fracture or failure during processing.

Additionally, once active PV materials are deposited onto flexible substrate materials, the resulting unlaminated cells or strings of cells may be shipped to another facility for lamination and/or assembly into flexible or rigid solar modules. This strategic option both reduces the cost of shipping (lightweight flexible substrates vs. glass, for example), and enables the creation of partner-businesses for finishing and marketing PV modules throughout the world. Further details relating to the composition and manufacture of thin-film PV cells of a type suitable for use with the presently disclosed methods and apparatus may be found, for example, in U.S. Pat. Nos. 6,310,281, 6,372,538, and 7,194,197, all to Wendt et al., and in Provisional Patent Application Ser. No. 61/063,257, filed Jan. 31, 2008. These references are hereby incorporated into the present disclosure by reference for all purposes.

Figure 1:
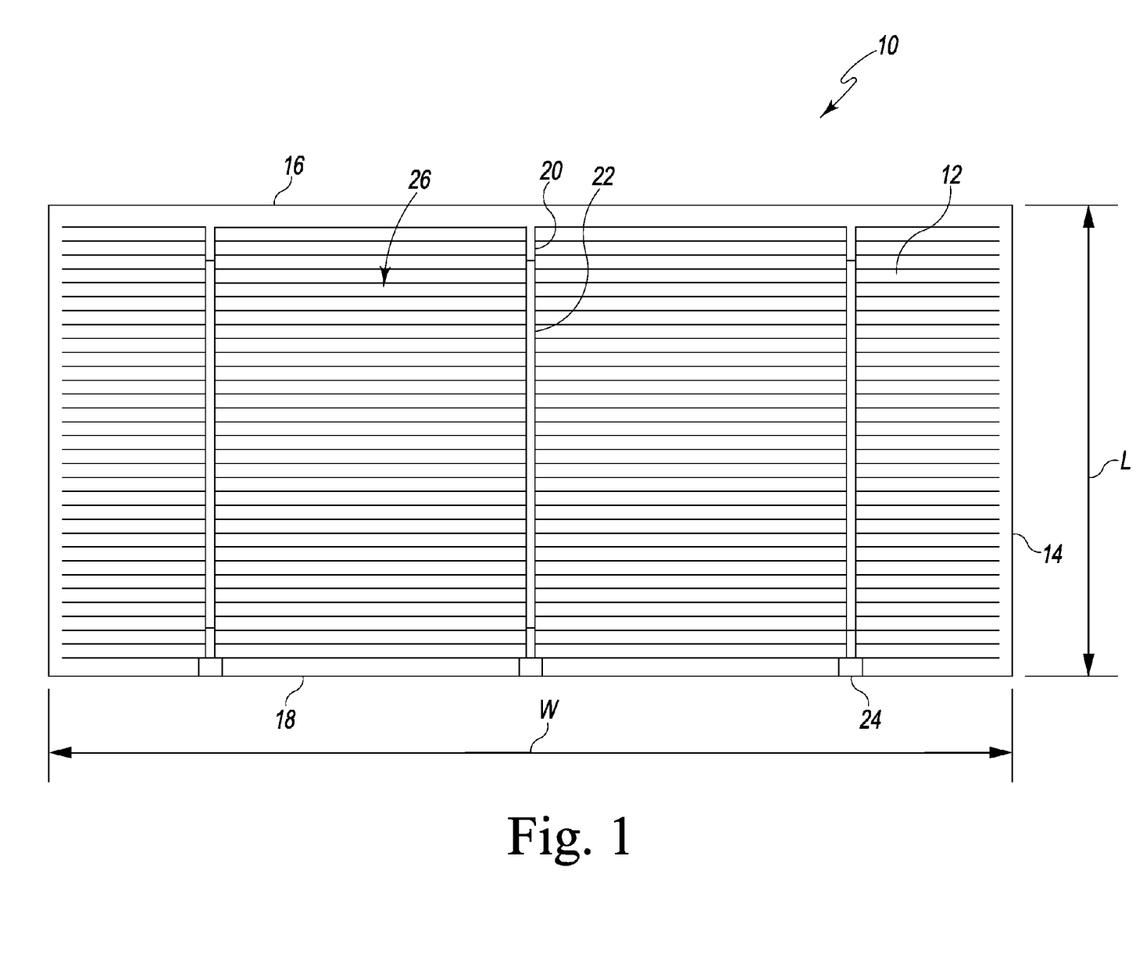
FIG. 1 is a top view of an exemplary thin film photovoltaic cell, according to aspects of the present teachings.

FIG. 1 shows a top view of an exemplary thin-film photovoltaic cell 10, in accordance with aspects of the present disclosure. Cell 10 is substantially planar, and typically rectangular as depicted in FIG. 1, although shapes other than rectangular may be more suitable for specific applications, such as for an odd-shaped rooftop or other surface. The cell has a top surface 12, a bottom surface 14 opposite the top surface, and dimensions including a length L, a width W, and a thickness. The length and width may be chosen for convenient application of the cells and/or for convenience during processing, and typically are in the range of a few centimeters (cm) to tens of cm.

More specifically, for example, the length of cell 10 may be approximately 100 millimeters (mm), and the width may be approximately 210 mm, although any other suitable dimensions may be chosen. The edges spanning the width of the cell may be characterized respectively as a leading edge 16 and a trailing edge 18. The total thickness of cell 10 depends on the particular layers chosen for the cell, and is typically dominated by the thickness of the underlying substrate of the cell. For example, a flexible stainless steel substrate may have thickness on the order of 0.025-0.035 mm (25-35 microns), whereas all of the other layers of the cell may have a combined thickness on the order of 0.002 mm (2 microns) or less. More generally, the substrate material in a roll-to-roll process is generally thin, flexible, and can tolerate a relatively high-temperature environment. Suitable materials include, for example, a high temperature polymer such as polyimide, or a thin metal such as stainless steel, steel or titanium, among others.

Cell 10 may be created by starting with a substrate, and then sequentially depositing multiple thin layers of different materials onto the substrate. When the substrate is flexible, this assembly may be accomplished through a roll-to-roll process whereby the substrate travels from a pay-out roll to a take-up roll, traveling through a series of deposition regions between the two rolls. Regardless of whether the PV material if manufactured in a roll-to-roll process or by some other technique, the material then may be cut to cells of any desired size and subsequently interconnected. Alternatively, various layers of the deposited material may be etched or otherwise divided during manufacture and then reconnected in situ, to form monolithically interconnected cells.

Sequential layers may be deposited onto the substrate of a PV cell in individual processing chambers by various processes such as sputtering, evaporation, vacuum deposition, and/or printing. The precise thickness of each layer depends on the exact choice of materials and on the particular application process chosen for forming each layer. Further details regarding these layers, including possible specific layering materials, layer thicknesses, and suitable application processes for each layer are described, for example, in U.S. Pat. No. 7,194,197.

In some cases, a plurality of cells may be joined together in electrical series using electrically conductive tabs. To facilitate this interconnection, a conductive layer in the form of one or more relatively narrow conductive strips 20 may be deposited. These strips may be constructed from any suitable conductive material, including metals such as copper, tin, silver, or an appropriate alloy, and may extend across most or all of length L of the cell. The width of each strip 20 may be chosen according to the overall scale of the cell.

Electrically conductive adhesive 22 (ECA) may be disposed on each of strips 20. Alternatively, the ECA may be deposited on conductive tabs to be attached to the cells, rather than on the cells themselves. One or more dielectric patches 24 also may be applied adjacent to the trailing edge of the cell and either overlapping or adjacent to the associated conductive strip, to provide a nonconductive barrier at the trailing edge of the cell. Conductive strips 20 may be adjacent to or contiguous with a conductive collection grid 26 that appears as a plurality of horizontal lines in FIG. 1.

Figure 2:
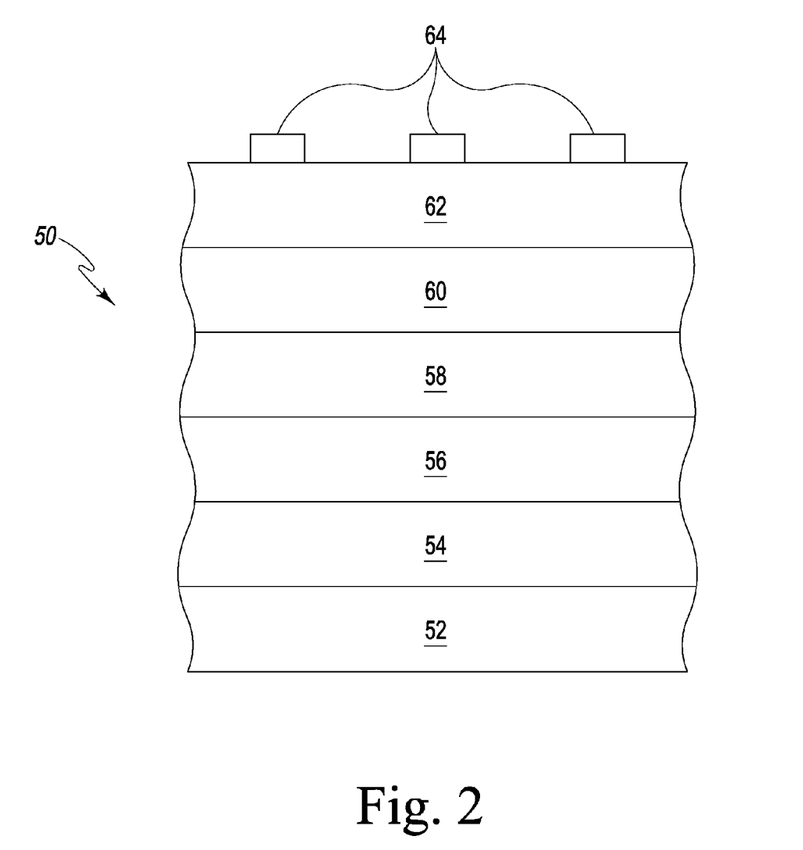
FIG. 2 is a sectional view of a portion of another thin film photovoltaic cell, according to aspects of the present teachings.

FIG. 2 shows a cross sectional view of a portion of an exemplary thin film photovoltaic cell, generally indicated at 50. Cell 50 includes a substrate layer 52, an adhesion layer 54 disposed above the substrate layer, a diffusion barrier layer 56 (which also serves as an electrical back contact layer) disposed above the adhesion layer, a p-type semiconductor layer 58 disposed above the diffusion barrier layer, an n-type semiconductor layer 60 disposed above the p-type semiconductor layer, a front electrode layer 62 disposed above the n-type semiconductor layer, and a collection grid 64 disposed above the front electrode layer. Additional layers (not shown) such as a protective layer on the back side of the substrate, adhesive layers, and/or encapsulant layers, among others, also may be deposited or otherwise applied to cell 50.

Suitable materials for substrate layer 52 include, for example, a high temperature polymer such as polyimide, or a thin metal such as stainless steel or titanium, among others. Suitable materials for adhesion layer 54 include chromium (Cr), among others. As described below, in some cases the adhesion layer may be omitted. Suitable materials for diffusion barrier/back contact layer 56 include molybdenum (Mo) and various oxides that will be described in more detail below, among others.

Suitable materials for p-type semiconductor layer 58 include, for example, copper indium diselenide, copper indium disulfide, copper indium aluminum diselenide, or copper indium gallium diselenide (CIGS). Suitable materials for n-type semiconductor layer 60 include, for example, cadmium sulfide (CdS). Suitable materials for front electrode layer 62 include various transparent conducting oxides (TCO). Suitable materials for collection grid 64 include, for example, silver (Ag) and other conductive metals.

The layers above substrate 52 typically are sequentially deposited onto the substrate in individual processing chambers by various processes such as sputtering, evaporation, vacuum deposition, chemical deposition, and/or printing. For instance, exemplary materials, thicknesses and methods of application of each layer described above are as follows, proceeding in typical order of application of each layer onto the substrate. These specifications are merely exemplary. The materials, dimensions and application methods can be varied significantly.

| Layer Description | Exemplary Material | Exemplary Thickness | Exemplary Method of Application |
| --- | --- | --- | --- |
| Substrate | Stainless steel | 25 μm | N/A (stock material) |
| Adhesion layer | Cr | 50 nm | Sputtering |
| Diffusion barrier | Mo | 300 nm | Sputtering |
| P-type layer | CIGS | 1700 nm | Evaporation |
| N-type layer | CdS | 80 nm | Chemical deposition |
| Front electrode | TCO | 250 nm | Sputtering |
| Collection grid | Ag | 40 μm | Printing |

Chromium adhesion layer 54, when present, promotes adhesion of the subsequent diffusion barrier layer 56, which as mentioned above can be constructed from molybdenum in some cases. Layer 56 serves as a diffusion barrier for substrate components such as iron and chromium, as well as a relatively chemically inert template for p-type semiconductor (e.g., CIGS) growth. Both layers 54 and 56 are often polycrystalline, in which case they exhibit a mostly columnar grain structure. Polycrystalline molybdenum can adsorb oxygen and sodium at its grain boundaries, which may promote greater efficiency in a thin film cell.

In addition to the purposes described above, diffusion barrier layer 56, and in some cases also adhesion layer 54, may serve the purpose of planarizing the surface of substrate 52, to provide a relatively uniform, featureless surface upon which the p-type semiconductor layer may be grown. This planarization may result in greater cell efficiencies and in more consistent and reliable cell performance, for instance by helping to avoid shunts in the p-type semiconductor layer that may result from surface roughness. Improved planarization can also allow a reduction in the thickness of the diffusion barrier layer, resulting in a reduced manufacturing cost.

More generally, aside from planarization, the features of the incoming substrate material may have a significant impact on the deposition process for the subsequent thin film coatings to form a high efficiency solar cell. For example, any contaminant on either the surface of the incoming substrate or in the bulk deposition materials can contaminate the thin film structure, and most importantly the p-type semiconductor layer, by diffusion. Accordingly, the layers underlying the p-type semiconductor layer can play a significant role in the performance of a thin film photovoltaic cell.

High surface roughness of the substrate may require a thicker than otherwise needed diffusion barrier layer, to avoid diffusion at the locations of the irregularities. Reducing surface roughness is also expected to reduce interface recombination that is dependent on junction area (to the extent that the p-type semiconductor layer is conformal), which in turn would improve open circuit voltage (Voc) and fill factor (FF). Adhesion is another critical property that is affected strongly by the nature of the interface at the p-type semiconductor/back contact.

Accordingly, rather than having a polycrystalline structure, layers 56 and/or 54 may be formed as amorphous layers, microcrystalline layers, nanocrystalline layers, or textured layers having a grain size or surface roughness less than some predetermined limit. This is described below in the following examples.

Example 1

According to aspects of the present teachings, diffusion barrier layer 56 may be an amorphous barrier layer. This layer would be used as a chemical barrier, as well as to planarize the substrate surface and provide a smooth p-type semiconductor template. The amorphous layer can be constructed from various materials, including metals, conductive nitrides, conductive oxides, conductive carbides, and mixtures thereof. Some specific examples of suitable materials for an amorphous barrier layer include molybdenum, aluminum doped zinc oxide (AZO), tin oxide (SnO), indium tin oxide (ITO), zinc tin oxide (SnZnO), titanium nitride (TiN) and silicon nitride (SiN). Furthermore, an amorphous barrier layer may or may not contain sodium.

Using an amorphous barrier layer 56 rather than a polycrystalline barrier layer may provide certain advantages. The main diffusion through the barrier layers happens on the grain boundaries and other crystallographic defects of the thin film. Most films grown at high rates are columnar in structure with many grain boundaries lined up vertically through the film. The granular structure of the layer contributes to the surface roughness of the template that is used for p-type semiconductor growth. In contrast, amorphous layers eliminate grain boundaries and can be grown as much denser layers, providing a better diffusion barrier. Also, the surface of an amorphous layer can be essentially featureless, providing a relatively smooth surface for p-type semiconductor growth.

Furthermore, an amorphous dense structure of a molybdenum barrier layer 56 would reduce the amount of sodium that can be dissolved in the layer, potentially making p-type semiconductor deposition more reliable. In addition, parts of the barrier layer can be grown with sodium compounds such as $NaMoO_4$ in co-deposition as a source of sodium for the p-type semiconductor layer.

Some alternative compounds have shown improved p-type semiconductor adhesion when used to replace molybdenum, which is a desirable result. Finally, the substrates, even after diffusion barrier coating (e.g., with molybdenum), may exhibit substantial differences in emissivity, related to the original surface roughness or even a change in molybdenum morphology dictated by the substrate surface. Emissivity is important to control, since it influences the growth temperatures in all subsequent process steps. More specifically, the surface temperature of the diffusion barrier layer (or more generally, the layer directly underlying the p-type semiconductor) influences the growth rate of the p-type semiconductor. Accordingly, it is desirable to control the emissivity of all of the layers underlying the p-type semiconductor, so that the growth surface temperature can be controlled. This may be easier to accomplish with one or more amorphous layers than with corresponding polycrystalline layers.

Example 2

Alternatively or in addition to an amorphous barrier layer 56, adhesion layer 54 also may be grown in an amorphous fashion. Including an amorphous adhesion layer 54 alternatively or in addition to an amorphous barrier layer 56 may help to provide a relatively featureless growth surface for the subsequent application of the p-type semiconductor layer. Amorphous growth of layers 54 and/or 56 can be achieved, for example, by high rate deposition on relatively cool substrate material.

Example 3

Figure 3:
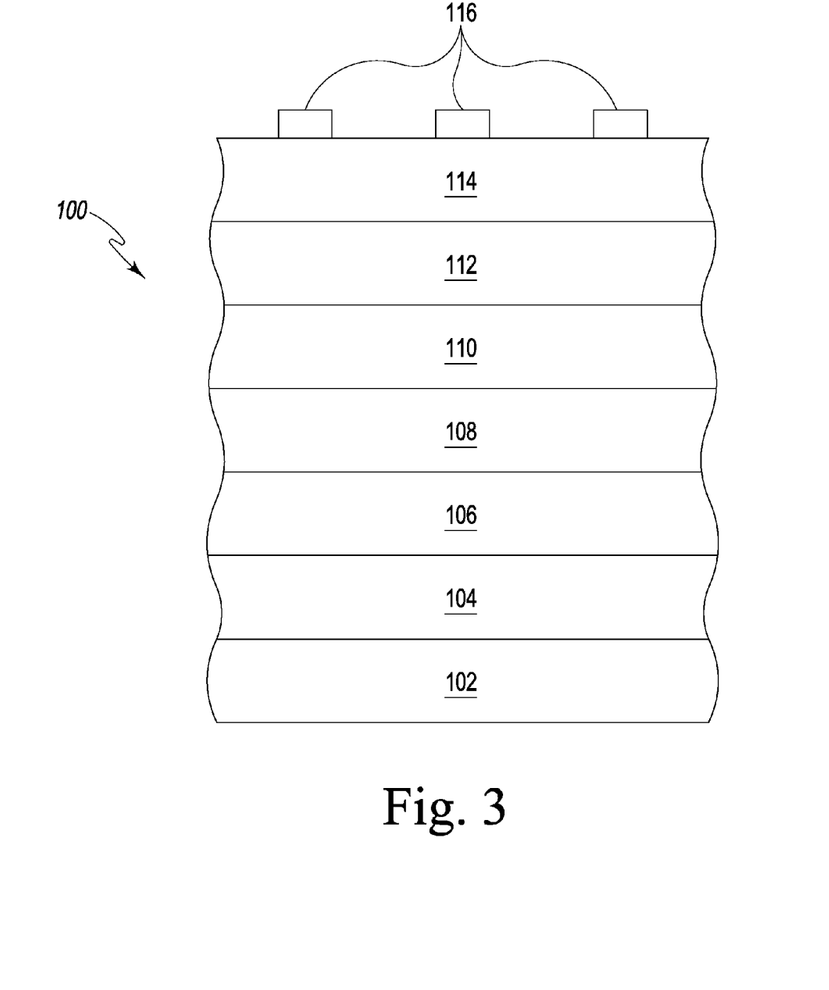
FIG. 3 is a sectional view of a portion of another thin film photovoltaic cell, according to aspects of the present teachings.

As depicted in FIG. 3, an amorphous barrier layer may be disposed between an adhesion layer and a more conventional barrier layer. Specifically, FIG. 3 shows a cross sectional view of a portion of an exemplary thin film photovoltaic cell, generally indicated at 100. Cell 100 includes a substrate layer 102, an adhesion layer 104 disposed above the substrate layer, an amorphous barrier layer 106 disposed above the adhesion layer, conventional diffusion barrier layer 108 (which also serves as an electrical back contact layer) disposed above the adhesion layer, a p-type semiconductor layer 110 disposed above the diffusion barrier layer, an n-type semiconductor layer 112 disposed above the p-type semiconductor layer, a front electrode layer 114 disposed above the n-type semiconductor layer, and a collection grid 116 disposed above the front electrode layer.

The materials suitable for constructing the various layers of cell 100 may be generally similar to the materials described with respect to cell 50 of FIG. 2, except that in cell 100, amorphous barrier 106 is added to the cell and sandwiched between the adhesion layer and a conventional diffusion barrier layer, which will typically be formed from molybdenum. As in the case of cell 50, additional layers (not shown) such as a protective layer on the back side of the substrate, adhesive layers, and/or encapsulant layers, among others, also may be deposited or otherwise applied to cell 118.

Example 4

Figure 4:
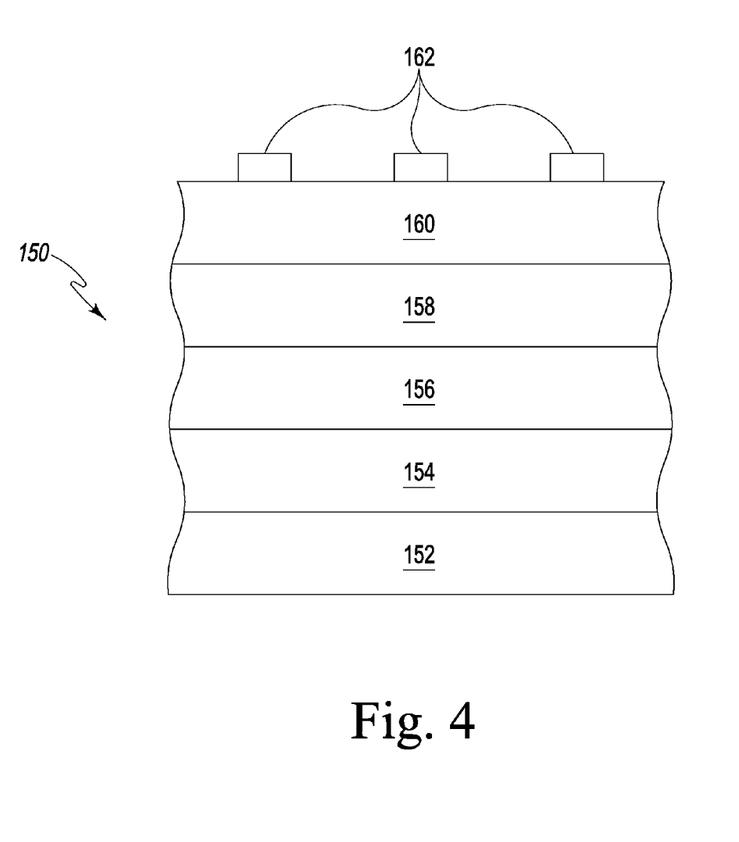
FIG. 4 is a sectional view of a portion of another thin film photovoltaic cell, according to aspects of the present teachings.

As depicted in FIG. 4, an amorphous barrier layer may replace both an adhesion layer and a more conventional barrier layer. Specifically, FIG. 4 shows a cross sectional view of a portion of an exemplary thin film photovoltaic cell, generally indicated at 150. Cell 150 includes a substrate layer 152, an amorphous barrier layer 154 disposed above the substrate layer, a p-type semiconductor layer 156 disposed above the barrier layer, an n-type semiconductor layer 158 disposed above the p-type semiconductor layer, a front electrode layer 160 disposed above the n-type semiconductor layer, and a collection grid 162 disposed above the front electrode layer.

Cell 150 does not include an adhesion layer or a conventional (e.g., polycrystalline molybdenum) diffusion barrier layer. Rather, amorphous barrier layer 154 may be configured in this case to be the only barrier layer. As in the case of the previously described cells, however, additional layers (not shown) such as a protective layer on the back side of the substrate, adhesive layers, and/or encapsulant layers, among others, also may be deposited or otherwise applied to cell 150.

Example 5

In another implementation, a diffusion barrier layer can be a predominantly textured layer with a grain size less or on the order of the layer thickness. For example, the layer can be formed of a conductive nitride (TiN, titanium oxy-nitride, titanium aluminum nitride, Zr nitride, Hf nitride, Y nitride, Sc nitride, La nitride, other rare earth nitrides, N deficient Al nitride, doped Al nitride, Mg nitride, Ca nitride, Sr nitride, Ba nitride, or combination thereof), conductive oxide (Al doped ZnO, ITO, doped or reduced SnO or mnO, or the like), a conductive carbide layer (SiC or WC) or mixtures thereof (e.g., WNC). The conductive nitride or carbide can be partially converted to oxide either intentionally or unintentionally during further processing. A diffusion barrier layer as described in this example could be used as any of layers 56, 106, or 154 shown in FIGS. 2-4.

Example 6

Figure 5:
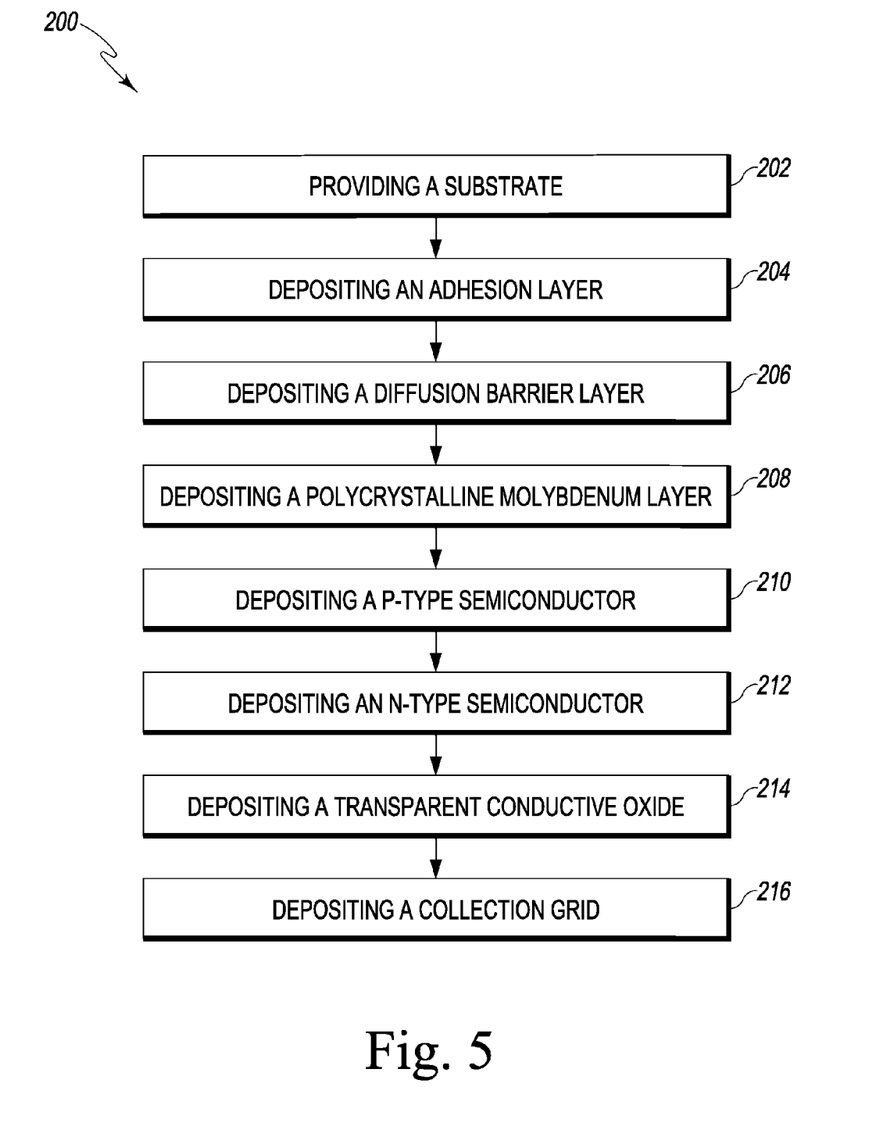
FIG. 5 is a flow chart depicting methods of manufacturing thin film photovoltaic cells, according to aspects of the present teachings.

This example describes methods of manufacturing a thin film photovoltaic cell including one or more of the diffusion barriers described above. FIG. 5 is a flow chart depicting such a method, generally indicated at 200, according to aspects of the present teachings. At step 202, a base substrate is provided. The substrate may be constructed from any suitable flexible material, for example a high temperature polymer such as polyimide, or a thin metal such as stainless steel, steel or titanium, among others. In some cases, the substrate may be electrically conductive.

The substrate will generally have a surface roughness that may, for example, be characterized by a profile roughness parameter that is less than some particular predetermined roughness threshold. For example, the substrate may have surface roughness characterized by a profile roughness parameter $R_a<50$ nm, $R_a<10$ nm, or even $R_a<1$ nm. These values of surface roughness may be obtained through various forms of polishing (such as mechanical polishing or electropolishing), or in some cases the roughness parameter may simply be a property of the stock substrate material.

At step 204, an adhesion layer is deposited onto the substrate. For example, the adhesion layer may be a polycrystalline chromium layer which is deposited by relatively high rate sputtering. Alternatively, as described above, the adhesion layer may be an amorphous chromium layer which is grown at a relatively lower rate. In some cases, the adhesion layer may be omitted entirely.

At step 206, a diffusion barrier layer is deposited above the substrate and also (if an adhesion layer is provided) above and onto the adhesion layer. The diffusion barrier layer is configured to have a surface with roughness less than the predetermined roughness threshold that characterizes the substrate. In other words, the diffusion barrier layer may be substantially similar in its surface roughness to the surface roughness of the substrate. As described previously, this can have a number of desirable effects, such as controlling undesirable diffusion of contaminants, providing a relatively smooth template for p-type semiconductor deposition, and reducing costs by reducing or eliminating the need for an additional polycrystalline molybdenum barrier layer.

The barrier layer provided in step 206 may be constructed from any of the materials described previously for constructing barrier layers 56, 106, or 154 shown in FIGS. 2-4. For example, suitable materials include amorphous molybdenum as well as the various conductive oxides, conductive nitrides, conductive carbides and combinations therefore that have been enumerated above. In some cases, the diffusion barrier layer may contain sodium.

At step 208, a more conventional polycrystalline molybdenum barrier layer may be deposited onto the diffusion barrier layer provided in step 206. In some cases, this step may be omitted, or the thickness of the conventional molybdenum layer may be significantly reduced due to the presence of the underlying barrier layer.

At steps 210, 212, 214 and 216, respectively, a p-type semiconductor layer is deposited onto the topmost barrier layer, an n-type semiconductor layer is deposited on the p-type semiconductor layer, a transparent conductive oxide layer is deposited on the n-type semiconductor layer, and a conductive collection grid is deposited on the transparent conductive oxide layer. Deposition of these layers is described above and in the incorporated references.

In summary, providing a diffusion barrier layer according to the present teachings may result in one or more of the following advantages as compared to providing only conventional polycrystalline diffusion barriers in thin film photovoltaic cells.

A diffusion barrier layer according to the present teachings may facilitate equalization and/or control of the following properties of the incoming substrate material upon which subsequent layers are deposited:
i. Surface properties (e.g., roughness, surface contamination)
ii. Bulk composition (of the diffusion barrier itself)
iii. Emissivity (by controlling, e.g., material properties, surface morphology)
iii. Consistent template for molybdenum growth (morphology control)

A diffusion barrier layer according to the present teachings may provide a lower cost replacement for molybdenum, or lower cost partial replacement of a molybdenum diffusion barrier layer.

A diffusion barrier layer according to the present teachings may be as flexible as, or more flexible than, a more conventional polycrystalline diffusion barrier layer.

A diffusion barrier layer according to the present teachings may reduce surface roughness at the surface of the subsequently deposited p-type semiconductor layer, and consequently may reduce p-n junction area and junction recombination.

A diffusion barrier layer according to the present teachings may promote p-type semiconductor adhesion, such as CIGS layer adhesion.

A diffusion barrier layer according to the present teachings may be electrically conductive and therefore may allow current transport between the layers above the diffusion barrier layer (e.g., the semiconductor layers and any addition diffusion barrier layers) and the substrate below.

For all of these reasons, diffusion barrier layers and various combinations and sub-combinations of diffusion barrier layers as described herein may be desirably incorporated into thin film photovoltaic cells.

We claim:
1. A thin-film photovoltaic cell, comprising:
an electrically conductive substrate including substrate components selected from the group consisting of iron and chromium;
a first diffusion barrier layer including an amorphous molybdenum layer disposed above the substrate;
a rear electrode layer formed of polycrystalline molybdenum formed upon the diffusion barrier layer;
a p-type semiconductor layer disposed above the rear electrode layer;
an n-type semiconductor layer disposed above the p-type semiconductor layer;
a front electrode layer disposed above the n-type semiconductor layer; and
a collection grid disposed above the front electrode layer.

2. The thin-film photovoltaic cell of claim 1, wherein the first diffusion barrier layer includes a material selected from the group consisting of aluminum doped zinc oxide (AZO), tin oxide (SnO), indium tin oxide (ITO), zinc tin oxide (SnZnO) and titanium nitride (TiN).

3. The thin-film photovoltaic cell of claim 1, wherein the first diffusion barrier layer consists essentially of an amorphous layer of molybdenum.

4. The thin-film photovoltaic cell of claim 1, wherein the first diffusion barrier layer is a textured layer having a thickness, and a grain size on an order of the thickness.

5. The thin-film photovoltaic cell of claim 1, further comprising an adhesion layer disposed between the substrate layer and the first diffusion barrier layer.

6. A method of manufacturing a thin-film photovoltaic cell, comprising:
providing an electrically conductive substrate including substrate components selected from the group consisting of iron and chromium, and having a surface with roughness less than a predetermined roughness threshold;
providing a diffusion barrier layer including an amorphous molybdenum layer above the substrate, the diffusion barrier layer having a surface with roughness less than the predetermined roughness threshold;
providing a polycrystalline molybdenum electrode layer above the diffusion barrier layer; and
depositing a p-type semiconductor layer on the electrode layer.

7. The method of claim 6, further comprising depositing an n-type semiconductor layer on the p-type semiconductor layer to form a p-n junction.

8. The method of claim 7, wherein the p-type semiconductor layer is a CIGS layer, and the n-type semiconductor layer is a CdS layer.

9. The method of claim 7, further comprising depositing a transparent conductive oxide layer on the n-type semiconductor layer, and depositing a conductive collection grid on the transparent conductive oxide layer.

10. The method of claim 6, wherein the predetermined roughness threshold is a profile roughness parameter of 10 nm.

11. The method of claim 6, wherein the diffusion barrier layer consists essentially of amorphous molybdenum.

12. The method of claim 6, wherein the diffusion barrier layer includes a material selected from the group consisting of conductive nitrides, conductive oxides, conductive carbides, and mixtures thereof.

13. A method of manufacturing a thin-film photovoltaic cell, comprising:
providing a flexible, electrically conductive substrate including substrate components selected from the group consisting of iron and chromium;
depositing an adhesion layer onto the substrate;
depositing an amorphous diffusion barrier layer onto the adhesion layer, wherein the amorphous diffusion barrier layer includes a layer of amorphous molybdenum;
depositing an electrode layer formed of polycrystalline molybdenum onto the diffusion barrier layer; and
depositing a p-type semiconductor layer onto the electrode layer.

14. The method of claim 13, wherein the adhesion layer is an amorphous layer of chromium.

15. The method of claim 13, wherein the diffusion barrier layer has a surface roughness less than a predetermined threshold.

16. The method of claim 13, wherein the diffusion barrier layer contains sodium.

* * * * *